United States Patent [19]

Moore

[11] Patent Number: 4,498,138
[45] Date of Patent: Feb. 5, 1985

[54] ELECTRONIC WATT/VAR TRANSDUCER

[75] Inventor: Prentice G. Moore, Clearwater, Fla.

[73] Assignee: Square D Company, Palatine, Ill.

[21] Appl. No.: 543,742

[22] Filed: Oct. 20, 1983

Related U.S. Application Data

[63] Continuation of Ser. No. 441,832, Nov. 15, 1982, abandoned, which is a continuation of Ser. No. 194,195, Oct. 6, 1980, abandoned.

[51] Int. Cl.³ .................. G01R 19/00; G06G 7/16
[52] U.S. Cl. ........................ 364/483; 364/841; 324/76 R; 324/120; 324/142; 328/13; 328/160; 307/261; 307/498; 307/529
[58] Field of Search ............... 364/483, 829, 839, 841, 364/842, 851, 858; 307/277, 261, 498, 529; 328/158, 160, 13, 30, 186; 330/278, 282; 332/31 R; 324/76 R, 76 A, 103 R, 118, 120, 123 R, 123 C, 142

[56] References Cited

U.S. PATENT DOCUMENTS

| | | | |
|---|---|---|---|
| 3,746,851 | 7/1973 | Gilbert | 364/483 |
| 3,794,917 | 2/1974 | Martin et al. | 324/142 |
| 3,947,763 | 3/1976 | Milkovic | 324/142 |
| 4,055,804 | 10/1977 | Mayfield | 324/142 |
| 4,074,194 | 2/1978 | Wilkerson | 364/841 |
| 4,118,787 | 10/1978 | Arnoux | 364/483 |
| 4,275,349 | 6/1981 | Wintermute | 324/142 |

OTHER PUBLICATIONS

Korn et al., *Electronic Analog Computers*, McGraw-Hill Book Co., Inc., 1952, pp. 120-121.
Karplus et al., *Analog Methods*, McGraw-Hill Book Co. Inc., 2nd Edition, 1959, pp. 96-97.

*Primary Examiner*—Errol A. Krass
*Assistant Examiner*—Kevin J. Teska
*Attorney, Agent, or Firm*—Richard T. Guttman; Donald P. Reynolds; James W. Potthast

[57] ABSTRACT

A watt/var transducer utilizing the pulse width-pulse height modulation type of multiplying scheme wherein a stable squarewave is generated by switching from one reference voltage to another reference voltage, the output thereof is integrated to produce a stable triangular wave output, the gain of which can be simply adjusted by shorting the output of amplifying means to various points in a resistive means contained in feedback means from the output to the input of said amplifying means. The frequency of the triangular wave output is high relative to any alternating signal which may pass upon the power line to be monitored by the transducer such that those portions of said alternating signal sampled by the multiplier portion of the transducer appear to be non-alternating signals thereby rendering the transducer capable of multiplying alternating signals as well as non-alternating signals.

14 Claims, 12 Drawing Figures

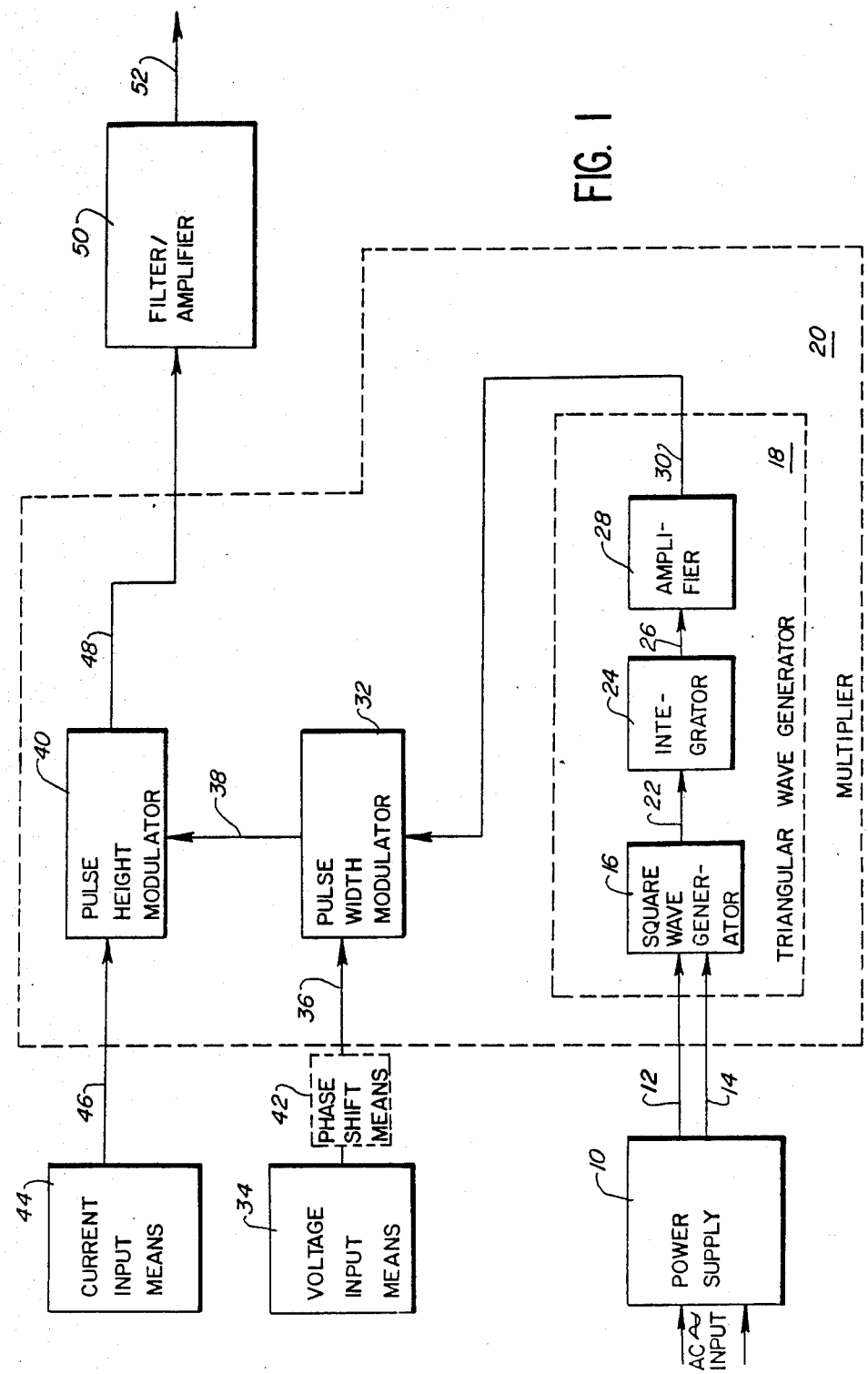

ELECTRONIC WATT/VAR TRANSDUCER

REFERENCE TO RELATED APPLICATION

This application is a continuation of application Ser. No. 441,832, filed Nov. 15, 1982, which in turn is a continuation of Ser. No. 194,195, filed Oct. 6, 1980, now abandoned.

BACKGROUND OF THE INVENTION

Centralized supervision and control of today's complex electric power systems has created the need for devices capable of converting the significant AC power system quantities into accurate proportional signals that can be easily transmitted, recorded and fed into data acquisition systems. These signals can also be used for process control where, for example, the power consumed is directly proportional to motor torque. For measurement of the main quantity, AC power, various watt transducers have been developed. A watt transducer converts AC watts into a DC current which is directly proportional to AC watts. It is a common misconception to assume that watt and var transducers sense power. This is not true. These devices sense voltage and current and subsequently compute power from those quantities. There are various methods of effecting that computation; the time division multiplication, perhaps more accurately termed pulse width-pulse height multiplication, method is perhaps the most accurate contemporary analog multiplication technique. The theory of this power computation method is based upon the principle that one input signal controls the width or duty cycle of a pulse train while a second input signal controls the amplitude of that pulse train. After the width and amplitude of the pulse train have been controlled (modulated) by the two input signals, the pulse train then passes through a low pass filter which retains only the DC component of the pulse train. Since the area of a rectangle is length×width, the resulting DC output voltage is therefore proportional to the product of the two input signals.

Of paramount importance in devices of this type is stability and accuracy of the performance of the device over changes in temperature and passages of time. The height of the triangular wave at the output of the triangular wave generator directly effects the stability of the overall performance of the device. The amplitude of this triangular wave must be extremely stable or the accuracy of the transducer will drift with temperature or over the passage of time. The amplitude of the triangular wave is, in turn, directly proportional to the amplitude of the squarewave input signal to the integrator within the triangular wave generator. Such squarewave inputs are traditionally produced by an output from a comparator in a feedback loop. The output of such a comparator essentially switches between its two supply voltages, which arrangement suffers from two problems: (1) The output circuit of the comparator often drifts with temperature changes; and, (2) Since the comparator switches between two supply voltages, it is necessary that the supply voltages themselves be very stable with changes in temperature and over passages of time.

It is, therefore, an object of this invention to provide a stable and accurate output over changes in temperature and passage of time by ensuring a uniform squarewave input to the integrator within the triangular wave generator which produces a triangular wave output such that the amplitude of that triangular wave output is extremely stable over changes in temperature and passage of time.

Another problem encountered with watt transducers of the pulse width-pulse height modulation multiplication type is the adjustment of the sensitivity of the transducer for various configurations used in power monitoring, such as 1, 2, and 3 element power monitoring. If one designs a one-element, single phase transducer to produce an output of one milliamp at 500 watts (a standard output recognized in industry), then for a three-phase, four-wire, three-element transducer, one must adjust the sensitivity of each of the three elements, since they are summed, to one-third of their one-element value in order to produce the same output current when the transducer sees a total of 1500 watts (500 watts per element). If this were not accomplished, the transducer would produce three times the output current for a three-element application as it would for a one-element application. The heretofore unsolved problem has been determining exactly where to adjust the sensitivity of each element in order to produce one-third of the output when three times the input is present.

It is, therefore, a further object of this invention to provide a transducer which is very simply adjustable to various multi-element applications without sacrificing stability or accuracy and without expensive redesigning of circuitry or reworking in a manufacturing facility.

Still another problem with transducers of this type is that they are difficult to calibrate and maintain after their installation. Equipment which is capable of controlling all three factors involved in computation of power (voltage, current and power factor) is expensive to produce and difficult to operate except within a highly controlled environment, such as a calibration laboratory. Further, transducers of this type presently available are complexly configured and generally must be returned to the manufacturer for repair.

It is, therefore, a still further object of this invention to provide a transducer capable of measuring alternating as well as non-alternating electrical signals and computing power therefrom, thereby allowing calibration of that transducer with non-alternating electrical signals which involves only two parts in power computation (voltage and current). Simpler, cheaper and more accurate calibration is thereby attainable.

It is yet another object of this invention to produce a transducer constructed in such a manner that such a device installed in the field can be easily repaired by insertion of pre-calibrated circuitboards on site with no sacrifice suffered in stability, accuracy of the device, or equipment downtime.

Further objects and features of the present invention will be apparent from the following specification and claims when considered in connection with the accompanying drawings illustrating the preferred embodiment of the invention.

SUMMARY OF THE INVENTION

The invention is a watt/var transducer in which an extremely stable squarewave is generated and integrated to produce a triangular wave of stable amplitude. The amplitude of the triangular wave is simply adjusted to accommodate multi-element applications of the transducer. The triangular wave is modulated by a voltage input proportional to the voltage in the power line monitored by the transducer to produce an output, the width of the waveform of which is proportional to the aforesaid voltage input. That output is then applied to modulate a current input proportional to the current in the power line monitored by the transducer to produce a fully modulated output, the width of the waveform of which is proportional to the aforesaid voltage input and the height of the waveform of which is proportional to the aforesaid current input. This fully modulated signal is then filtered to remove alternating current components thereof and to integrate and amplify the remaining direct current component to produce a direct current transducer output signal which is directly proportional to the instantaneous power in the power line from which the current input and voltage input were derived.

DESCRIPTION OF THE DRAWINGS

FIG. 1 is a block diagram of a complete watt/var transducer.

Figure 2A:
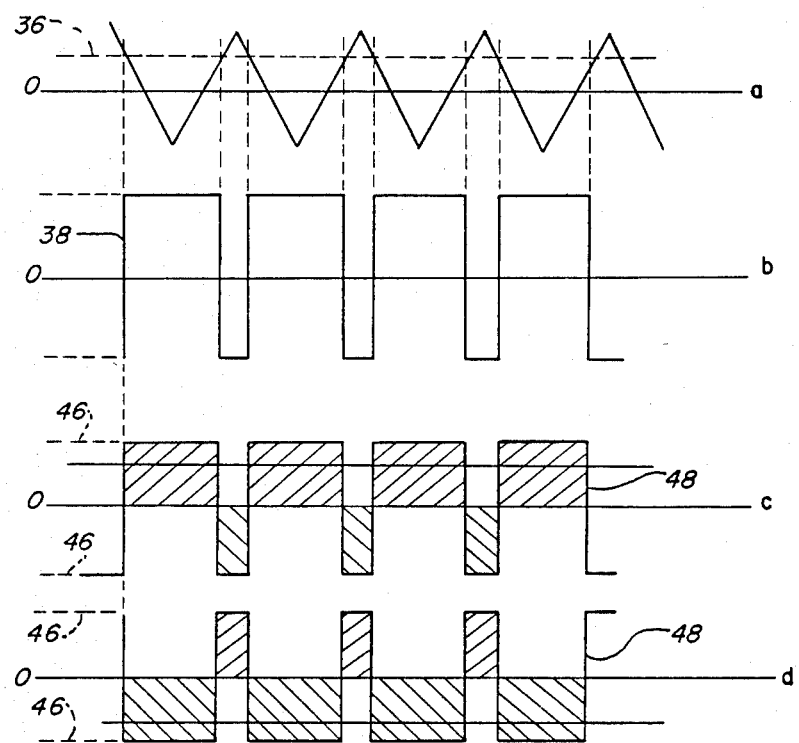
FIG. 2(a–g) is a representation of various waveforms present at locations within the transducer under different conditions.

In describing the preferred embodiment of the invention illustrated in the drawings, specific terminology will be resorted to for the sake of clarity. However, the invention is not intended to be limited to these specific terms so selected and it is to be understood that each specific term contains all technical equivalents which operate in a similar manner to accomplish a similar purpose. For example, the terms "connected" or "coupled", may include connection through other circuit elements wherein such connection is recognized as equivalent and operates in essentially the same manner to accomplish the same purpose.

DETAILED DESCRIPTION

A watt transducer is a device for sensing the voltage and current in a power line and multiplying that voltage and current to obtain a watt output signal proportional to the power present in the power line monitored by the transducer. Watt transducers measure what is known as active power, which is calculated by multiplying voltage × current × the cosine of the phase angle between the voltage and current. This quantity, cosine of the phase angle, is known as power factor, and, in purely resistive loads, the phase angle is zero, thereby rendering the power factor (cosine of the phase angle) equal to a value of one.

A var transducer is a device for sensing the voltage and reactive current in a power line. Reactive current, that current necessary to establish the magnetic field on inductive loads, is sometimes known as magnetizing current. A var transducer multiplies the voltage and reactive current quantities × the sine of the phase angle between those two quantities to produce a watt output signal proportional to the reactive power in the power line being monitored by the var transducer. Since the sine of an angle is equal to the cosine of 90 degress minus that angle, by shifting the voltage input from a power line by 90 degrees, one can use the circuitry of a watt transducer to measure reactive power in that power line.

FIG. 1 is a block diagram of the basic components of a watt/var transducer. Although FIG. 1 embodies the present invention, FIG. 1 is so simplified that it differs very little from similar prior art.

Referring to FIG. 1, a power supply 10 provides various operating voltages, represented by 12 and 14, to various components within the transducer, including a squarewave generator 16 within a triangular wave generator 18 which comprises a portion of a multiplier 20. The power supply 10 is of a very stable type well-known in the art. The squarewave generator 16 produces a squarewave output 22 to an integrator 24 which is a portion of the triangular generator 18 in the multiplier 20. The integrator 24 integrates the squarewave output 22 over time to produce a triangular waveform output 26 to an amplifier 28 of the triangular wave generator 18 within the multiplier 20. The amplifier 28 amplifies the triangular waveform output 26 to produce a triangular wave output 30 of precise amplitude. The waveform of the triangular wave output 30 is shown in FIG. 2-a.

The triangular wave output 30 is the output provided by the triangular wave generator 18 to a pulse width modulator 32. Voltage input means 34 of a type commonly known in the art monitor the power line, not shown, and produce a voltage representative signal 36 which is directly proportional to the instantaneous voltage present on the power line. This voltage representative signal 36 is the second input to the pulse width modulator 32 and is the modulating signal by which the pulse width modulator 32 modulates the triangular wave 30 to produce a pulse width modulated signal 38, shown in FIG. 2-b, to a pulse height modulator 40. The above-described relationship between the voltage input means 34 and the pulse width modulator 32 reflects the circuitry of a watt transducer. Should it be desired to monitor and represent reactive power, one may simply insert a phase shifter 42 in the circuit between the voltage input means 34 and the pulse width modulator 32. The purpose of the phase shifter 42 is to shift the output of the voltage input means 34 by 90 degrees to enable one to simulate measurement of the sine of the phase angle between the current and the voltage on the power line by actually measuring 90 degrees minus the cosine of that phase angle thereby achieving the capability of measuring the parameters necessary for the transducer to compute reactive power and produce a signal proportional thereto. Current input means 44 of a type commonly known in the art are employed to monitor the current present in the power line, not shown, and produce a current representative signal 46 which is directly proportional to the instantaneous current present on the power line. This current representative signal 46 comprises the second input to the pulse height modulator 40. The pulse height modulator 40 applies the pulse width modulated signal 38 as the modulating input to modulate the current representative signal 46 thereby producing a pulse width-pulse height modulated signal 48 which is identical in frequency to the pulse width modulated signal 38 but whose amplitude is equal to the amplitude of the current representative signal 46. The waveform of the pulse width-pulse height modulated signal 48 is shown in FIG. 2-c. As can be understood by one skilled in the art, this technique can be used to multiply two DC signals in all four quadrants; that is, all combinations of positive and negative voltage representative signals 36 and current representative signals 46, an example of the effect of which may be seen by comparing FIGS. 2-c and 2-d. The pulse width-pulse height modulated signal 48 is provided as the input to a filter/amplifier 50. The filter/amplifier 50 filters out alternating current components of the pulse width-pulse height modulated signal 48 and amplifies the remaining direct current components of that signal to produce a direct current transducer output signal 52 which is directly proportional to the instantaneous power in the power line.

The foregoing explanation presumes that the voltage representative signal 36 and the current representative signal 46 are direct current signals. The present watt transducer is capable of operating with alternating voltage representative signals 36 and alternating current representative signals 46. So long as the triangular wave output 30 is of a high frequency relative to the voltage representative signal 36 and the current representative signal 46, there can be ample sampling of the voltage and current on the power line to give an accurate representation of the power thereon. FIG. 2-e through 2-g illustrate the waveforms associated with the operation of this transducer with alternating input values 36 and 46. In FIG. 2-e, there appears a triangular wave 30 similar to FIG. 2-b and superimposed thereupon is an alternating waveform representative of the voltage representative signal 36. FIG. 2-f illustrates the pulse width modulated signal 38 comparable to FIG. 2-c for the direct current case. Superimposed thereupon are "mirror" waveforms indicating the operation of the pulse height modulator 40 upon an alternating current representative signal 46. FIG. 2-g is a recreation of the shaded areas contained in FIG. 2-f to clearly illustrate the resulting waveform of the pulse width-pulse height modulated signal 48 in the situation involving alternating input signals 36 and 46.

Figure 3:
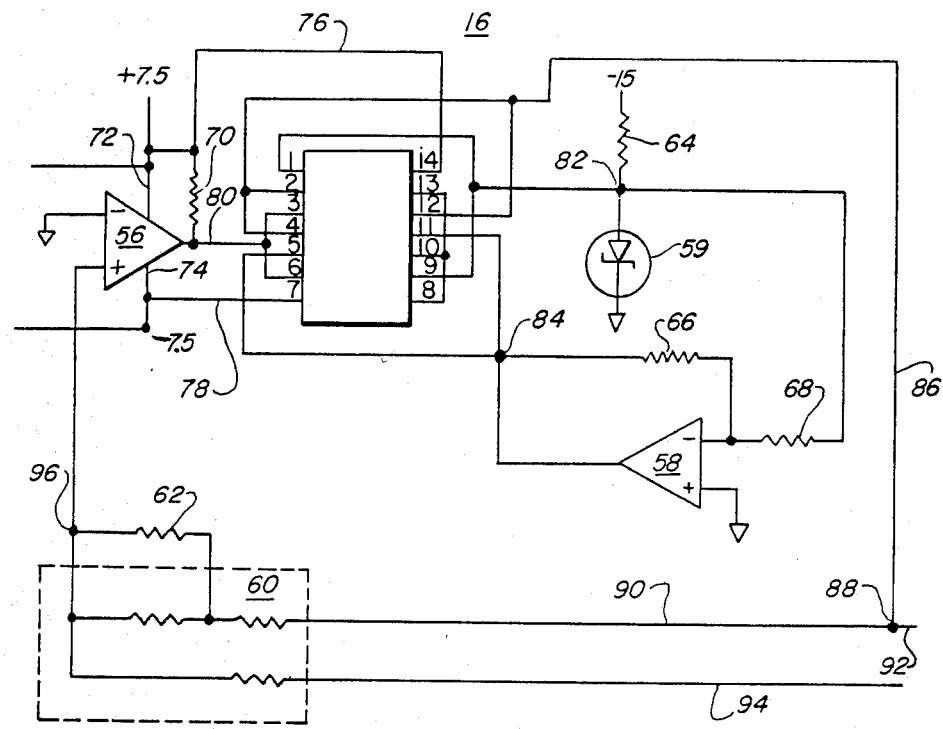
FIG. 3 is a schematic diagram representing the improved squarewave generator within the triangular wave generator of the transducer.

Referring to FIG. 3, the squarewave generator 16 is comprised of a comparator 56, a COS/MOS dual-complementary pair plus inverter 54, an operational amplifier (op-amp) 58, a thin film resistor network of high stability 60, resistors 62, 64, 66 and 68, and a pull-up resistor 70. The power supply 10 provides direct current operating voltages at a positive DC power supply input 72 and a negative DC power supply input 74 of the comparator 56. The positive DC power supply input 72 is electrically connected to the COS/MOS inverter 54 by an electrical line 76 thereby providing a similar operating voltage to COS/MOS inverter 54. Additionally, the negative DC power supply input 74 is electrically connected to the COS/MOS inverter 54 by an electrical line 78 thereby providing a similar negative operating voltage to the COS/MOS inverter 54. The pull-up resistor 70 is interconnected between a comparator output 80 and electrical line 76. The COS/MOS inverter 54 is situated in the squarewave generator circuit 16 in a manner allowing it to operate as a single pole, double throw electronic switch.

The power supply 10 also supplies an operating voltage to one end of the resistor 64. The other end of the resistor 64 is electrically connected to the COS/MOS inverter 54, the Zener diode 59 and the op-amp 58 through the resistor 68. The op-amp 58 and the resistor 66 are connected in a manner allowing the op-amp 58 to operate as a unity gain inverter. Thus, the Zener diode 59 creates a negative reference voltage at point 82 in the squarewave generator 16 and the op-amp 58 and resistor 66, operating as a unity gain inverter, provide a positive reference voltage, equal in amplitude but opposite in sign to the negative reference voltage, at point 84 in the squarewave generator 16. Output from the squarewave generator 16 to the integrator 24 of the triangular wave generator 18 is provided along electrical line 86. At a junction 88 in the squarewave generator 16, the output signal to the integrator 24 carried on electrical line 86 is split; a portion of that signal is carried to the integrator 24 along electrical line 92 and another portion of that signal is carried along electrical line 90 back to the comparator 56 via a portion of the thin film resistor network 60 and resistor 62. Feedback, in the form of a triangular wave, from the output of the integrator 24 is provided along electrical line 94 via a portion of the thin film resistor network 60 to the same terminal of the comparator 56 to which the electrical line 90 is connected.

Operation of the squarewave generator 16 is as follows: The COS/MOS inverter 54, operating as a single pole, double throw electronic switch, operates to select as an output along electrical line 86 either the negative reference voltage present at point 82 or the positive reference voltage present at point 84. The positioning of the COS/MOS inverter 54 operating as an electronic switch to choose between those two reference voltages is determined by the output 80 of the comparator 56. The pull-up resistor 70 enables the comparator 56 to provide both positive and negative operating signals to the COS/MOS inverter 54 thereby ensuring its operation as an electronic single pole, double throw switch. The portion of the electrical signal carried on line 86 which is returned to the comparator 56 by electrical line 90 is summed with the triangular wave feedback from the output of the integrator 24, which summing is accomplished by the common connection of electrical line 90 and electrical line 94 at junction 96 in the squarewave generator 16. Since the signal carried on electrical line 90 is a squarewave signal, its summing with the triangular wave signal on electrical line 94 will result in an electrical signal provided to the comparator 56 with zero-crossing characteristics which will cause comparator 56 to shift its output 80 to the COS/MOS inverter 54 from positive to negative or from negative to positive, thereby causing the COS/MOS inverter 54, operating as a signal pole, double throw electronic switch, to change its state so that where one of the reference voltages had previously been present on electrical line 86, now the other reference voltage will now be present along electrical line 86. Thus, the comparator 56 is not used in this circuit to provide the squarewave output to the integrator 24, but is merely used to provide triggering voltages to the COS/MOS inverter 54 operating as a single pole, double throw electronic switch. It is the COS/MOS inverter 54 which produces the squarewave output to the integrator 24 by, in response to the triggering voltages provided by the output 80 of the comparator 56, switching between the negative reference voltage present at point 82 and the positive reference voltage present at point 84, and applying each of those reference voltages, in turn, as output to the integrator 24 along electrical lines 86 and 92. That output is in the form of a squarewave, the peak values of which will correspond to the reference voltages present at points 82 and 84 in the squarewave generator 16.

Figure 4:
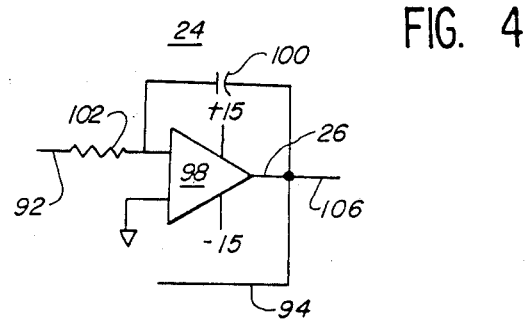
FIG. 4 is a schematic diagram representing the improved integrator of the triangular wave generator of the transducer.

Referring to FIG. 4, the integrator 24 is comprised of an operational amplifier (op-amp) 98, a capacitor 100 and an input resistor 102. The op-amp 98, in conjunction with the capacitor 100, operates as an integrating circuit which integrates with respect to time the input signal received from the squarewave generator 16 by electrical line 92 through input resistor 102. The triangular waveform output 26 of the op-amp 98 is provided to the amplifier 28 by electrical line 106 and is fed back to the squarewave generator 16 by electrical line 94. Since the COS/MOS inverter 54 changes slightly in resistance with changes in temperature, it is best that the input resistor 102 be very high in resistance with respect to the resistance of the COS/MOS inverter 54; resistances on the order of 75K ohms have been found to be appropriate. Establishing the resistance of input resistor 102 at such a relatively high level serves to render any instability attributable to changes in the resistance of the COS/MOS inverter 54 inconsequential, thereby ensuring a high degree of stability of the triangular waveform output 26 of the op-amp 98.

Figure 5:
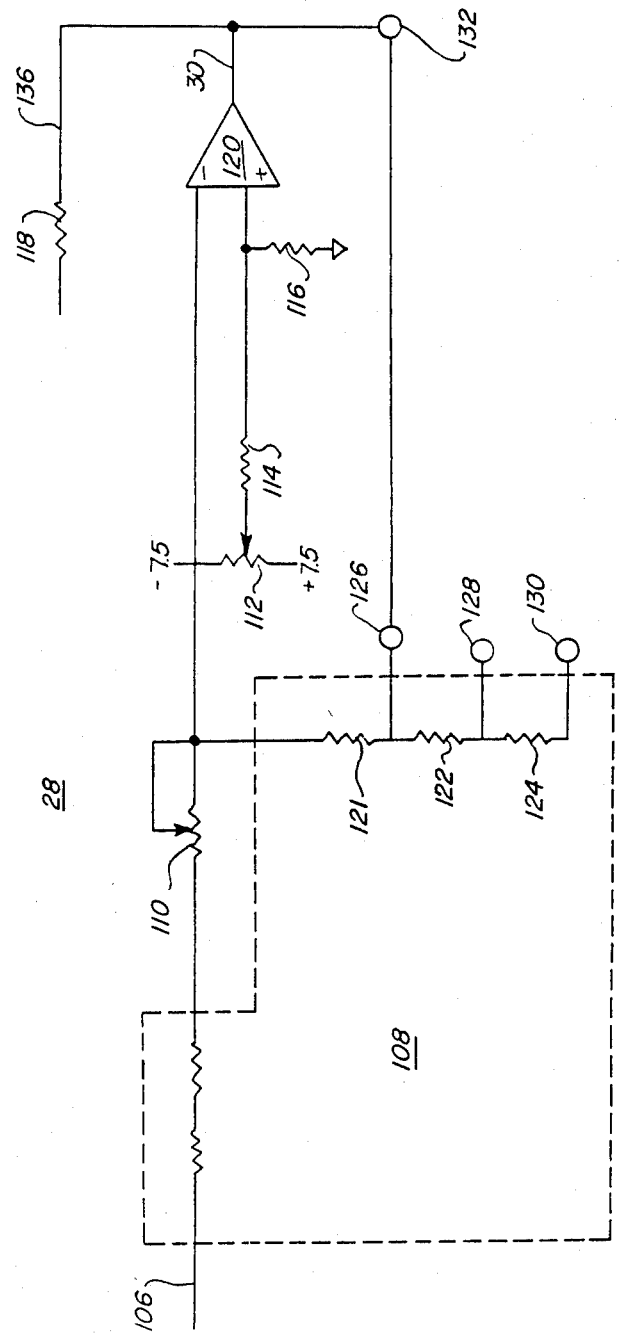
FIG. 5 is a schematic diagram representing the improved amplifier of the triangular wave generator of the transducer.

Referring to FIG. 5, the amplifier 28 of the triangular wave generator 18 is comprised of a thin film resistor network 108 with a very low tracking error, variable resistors 110 and 112, resistors 114, 116 and 118, and an operational amplifier (op-amp) 120. The op-amp 120 is connected with a portion of the thin film resistor network 108 in a manner by which it operates as a signal amplifier. Variable resistors 110 and 112 allow calibration of the amplifier 28.

Watt and var transducers are used to provide signals indicative of the active and reactive power, respectively, present in power lines. These transducers' outputs are used to drive instruments or to provide feedback indications to control devices in industrial processes and in similar applications. Industry standards have been established whereby the instruments, control circuits and the like are designed to respond to transducer output signals of a specified standard amplitude. This industry standard is generally set at one milliamp at 500 watts. Accordingly, regardless of how many phases or elements of a power line are monitored by a transducer, the output of that transducer must be produced at the industry's standard level in order that instruments, control circuits and the like responding to that transducer output signal can operate accurately and reliably. For instance, if a single phase or element designed transducer is used to monitor a three-element power line, its output would be on the order of 1500 watts, or three times the industry standard. This circuit provides a simple way to adjust the sensitivity of the transducer to accommodate multi-phase power monitoring applications. The sensitivity of the multiplier circuit in a transducer is inversely proportional to the height of the triangular wave provided to the pulse width and pulse height modulating portions. Therefore, by increasing the amplitude of the triangular wave by a factor of three, the circuit will have one-third the sensitivity that it had at its original amplitude. This adjustment of triangular wave amplitude is accomplished in this invention in the amplifier 28 of the triangular wave generator 18. The gain of the amplifier 28 is determined by the resistance in the feedback of the op-amp 120. This resistance in this invention is provided by resistors 120, 122 and 124 of the thin film resistor network 108. The resistors 120, 122 and 124 are all of equal resistance value. Therefore, through the very simple means of connecting a terminal 132 to various terminals 126, 128 and 130, one may very simply and inexpensively vary the feedback resistance of the op-amp 120 in equal increments, thereby "programming" the amplitude of the triangular wave output 30 of the op-amp 120 provided to the pulse width modulator 32 along electrical line 136 through resistor 118. By this method, connection of terminals 132 and 126 accommodates a one-element transducer application. Similarly, connection of terminals 132 and 128 accommodate two-element applications and connection of terminals 132 and 130 accommodate three-element applications.

Figure 6:
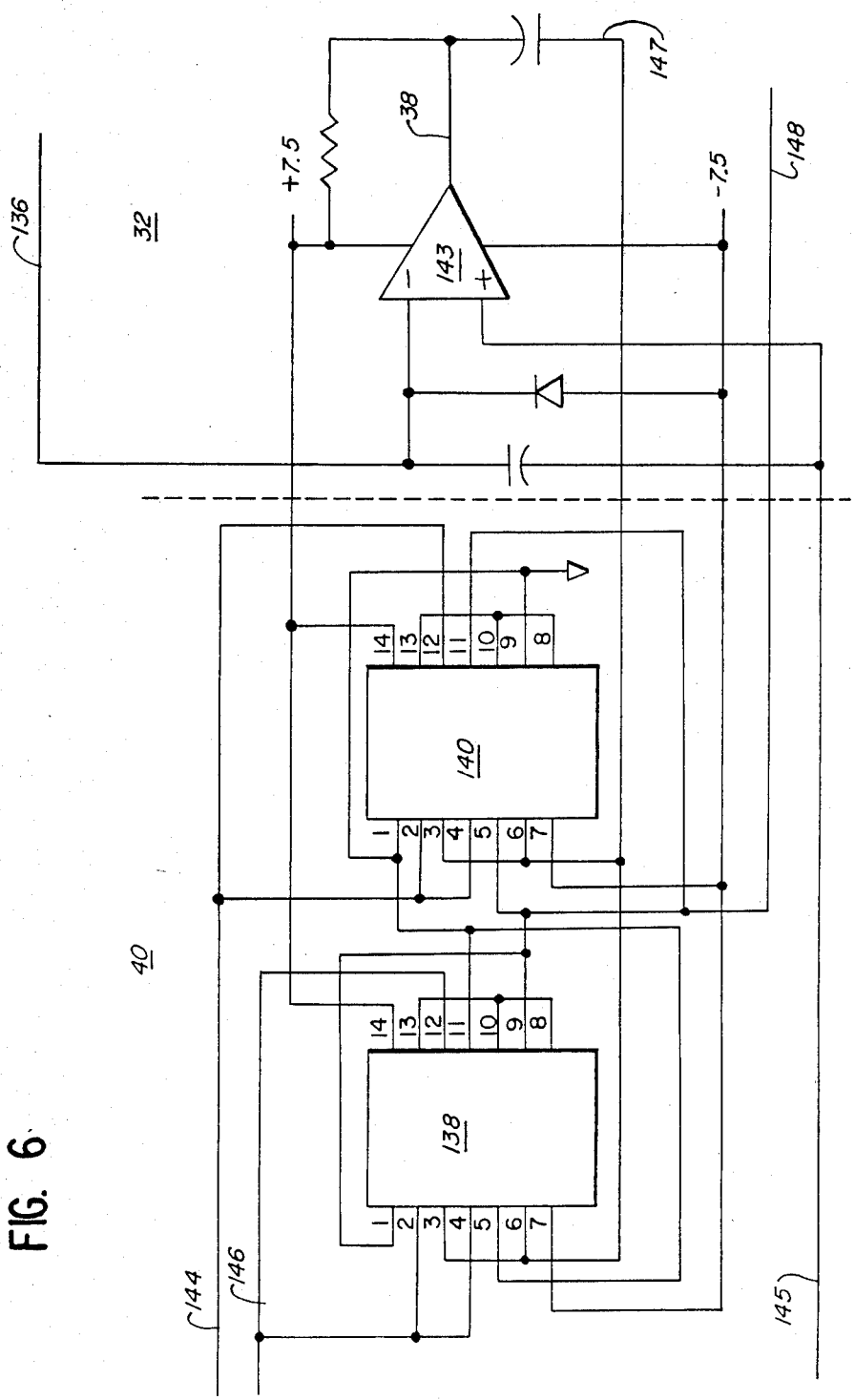
FIG. 6 is a schematic diagram of the pulse width modulator and the improved pulse height modulator of the transducer.

Referring to FIG. 6, an electrical line 136 carrying the triangular wave output 30 of amplifier 28 of the triangular wave generator 18 provides input to a pulse width modulator 32 of a type well-known in the art. The details of pulse width modulator 32 are illustrated in FIG. 6 merely to illustrate its interconnection and interaction with the pulse height modulator 40 wherein the novelty of this invention lies. The pulse width modulator receives the voltage representative signal 36 by an electrical line 145 which is connected to a comparator 143. The triangular wave output 30 of amplifier 28 of the triangular wave generator 18 is also provided to comparator 143 by electrical line 136. The behavior of the comparator 143 when the summation of voltage representative signal 36 and triangular wave output 30 creates zero-crossing situations serves to pulse width modulate the voltage representative signal 36 by the triangular wave output 30 to produce the pulse width modulated signal 38, shown in FIG. 2-b. This pulse width modulated signal is provided to the pulse height modulator 40 by electrical line 147.

Figure 2B:
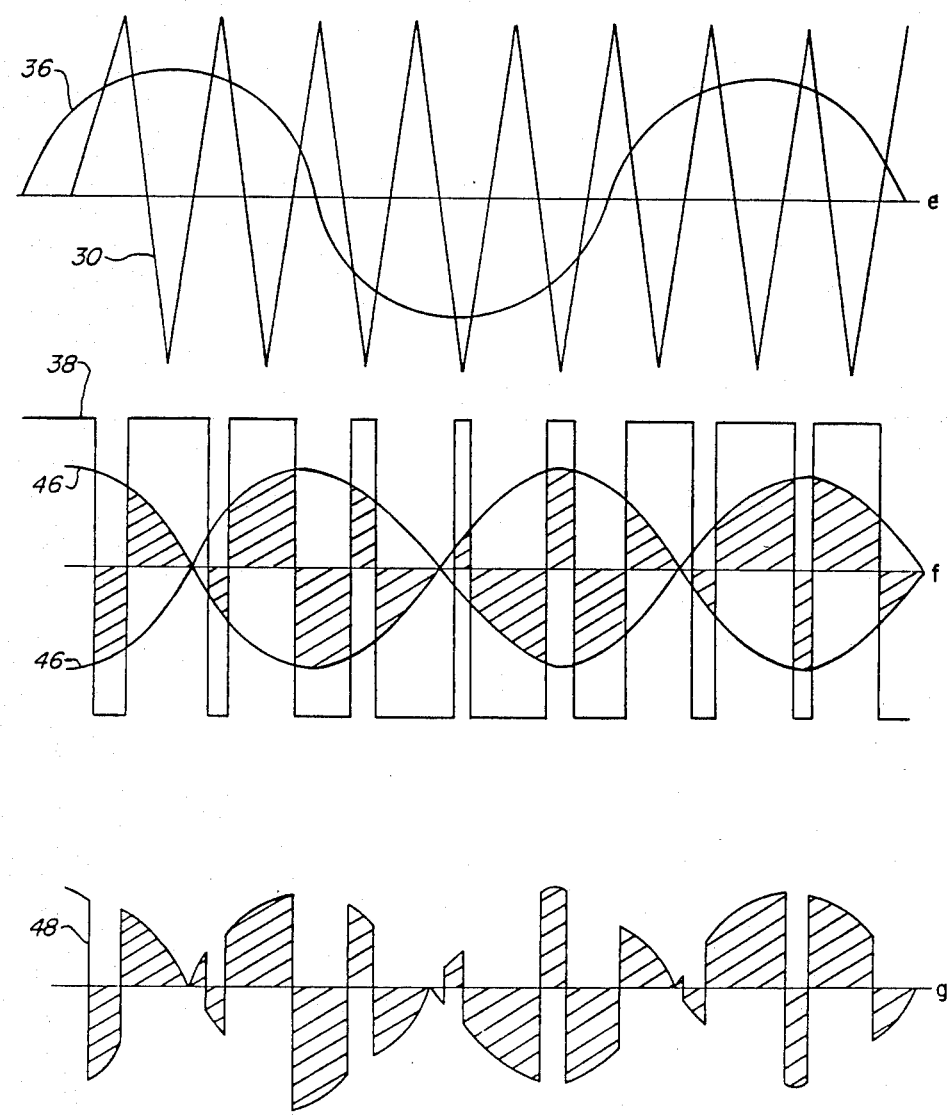

The pulse height modulator 40 is comprised of two COS/MOS dual-complementary pair plus inverters 138 and 140 interconnected in a manner whereby they operate as a unit as an electronic double pole, double throw switch. Previous devices of this kind have utilized single pole, double throw switches in the pulse height modulating function. Referring to FIG. 2, one may see the importance of the application of a double pole, double throw switch in this pulse height modulating function. At FIG. 2-a, the voltage representative signal of 36 is applied to the triangular wave output 30 of the amplifier 28 of the triangular wave generator 18 by the pulse width modulator 32. The pulse width moulated signal 38 of the pulse width modulator 32 is shown in FIG. 2-b. The pulse height modulator 40 then modulates the current representative signal 46 introduced to the pulse height modulator 40 by a current input signal line 144 and a current input signal line 146. The current representative signal 46 is modulated by the pulse width modulated signal 38 of the pulse width modulator 32 to produce the pulse width pulse height modulated signal 48 illustrated in FIG. 2-c. The significant aspect of FIG. 2-c is that waveforms below the zero voltage line are not disregarded but rather are included in the pulse width pulse height modulated signal 48 of the pulse height modulator 40 for later integration by the filter-/amplifier 50 to produce the transducer output signal 52. It is the application of a double pole, double throw switch to effect the pulse height modulation function that allows inclusion of portions of the pulse width pulse height modulated signal 48 below the zero voltage line in the integration process of the filter/amplifier 50, thereby ensuring greater accuracy of the transducer output signal 52 than would be attainable by only integrating those portions of the pulse width pulse height modulated signal 48 above the zero-voltage line illustrated in FIG. 2-c, as is the case when a single pole, double throw switch effects pulse height modulation. FIGS. 2e-g illustrate alternating signal applications corresponding respectively to FIGS. 2a-c, which depicted DC signal applications.

Referring once again to FIG. 6, the interconnection of the COS/MOS inverters 138 and 140 in order that they may operate as a unit as an electronic double pole, double throw switch is accomplished by connecting pin numbers as indicated in the following tables:

TABLE 1

| 138 Pin No. | CONNECTED TO | |
|---|---|---|
| | 138 Pin No. | 140 Pin No. |
| 1 | 9 | 5, 11 |
| 2 | 4, 12 | — |
| 3 | 6 | 3, 6 |
| 4 | 2, 12 | — |
| 5 | 11 | 1, 9 |
| 6 | 3 | 3, 6 |
| 7 | — | 7 |
| 8 | 10, 13 | — |
| 9 | 1 | 5, 11 |
| 10 | 8, 13 | — |
| 11 | 5 | 1, 9 |
| 12 | 2, 4 | — |
| 13 | 8, 10 | — |
| 14 | — | 14 |

TABLE 2

| 140 Pin No. | CONNECTED TO | |
|---|---|---|
| | 140 Pin No. | 138 Pin No. |
| 1 | 9 | 5, 11 |
| 2 | 4, 12 | — |
| 3 | 6 | 3, 6 |
| 4 | 2, 12 | — |
| 5 | 11 | 1, 9 |
| 6 | 3 | 3, 6 |
| 7 | — | 7 |
| 8 | 10, 13 | — |
| 9 | 1 | 5, 11 |
| 10 | 8, 13 | — |
| 11 | 5 | 1, 9 |
| 12 | 2, 4 | — |
| 13 | 8, 10 | — |
| 14 | — | 14 |

The pulse width pulse height modulated signal 48 of the pulse height modulator 40 is supplied to the filter/amplifier 50 via electrical line 148. The filter/amplifier 50 is of a type well-known in the art and serves to filter out alternating current components of the output of the pulse height modulator 40 and integrate and amplify the remaining direct current component of that output to produce a direct current transducer output signal 52 which is directly proportional to the instantaneous power in the power line monitored by the transducer.

It is of importance to note that this invention monitors and multiplies DC voltage representative signals 36 and current representative signals 46. Application of this invention to AC circuits is accomplished by ensuring the triangular wave output 30 of the amplifier 28 of the triangular wave generator 18 is of high frequency relative to the frequency of the voltage representative signal 36 and the current representative signal 46. FIGS. 2e-g illustrate the application of alternating input signals to this invention. If the triangular wave output 30 of the amplifier 28 of the triangular wave generator 18 is of sufficiently high frequency relative to the frequency of the voltage representative signal 36 and the current representative signal 46, then those portions "sampled" by the pulse width modulator 32 and the pulse height modulator 40 (that is, those areas cross-hatched in FIGS. 2f and 2g) will appear to the transducer as short segments of DC signals and will be treated as such by the transducer. The significance of this fact is that this transducer can therefore be calibrated with DC signals, a process which is much more easily accomplished than is calibration of such a device with AC signals. This is because computation of power associated with AC signals involves three factors: voltage, current and power factor. However, computation of power associated with DC signals involves only two factors: voltage and current. Therefore, simpler, cheaper and more accurate calibration is attainable by calibration with DC signals than is attainable with calibration by AC signals. Additionally, this facilitates pre-calibration of multiplier components prior to shipment to field locations, so that devices installed in the field can be easily repaired by insertion of pre-calibrated circuitboards on site with no sacrifice suffered in stability or accuracy of the device and minimal downtime of the equipment.

It is to be understood that, while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims:

I claim:
1. A transducer for monitoring power in a power line and having a power supply means, said transducer comprising:
  a. current input means for producing an output current representative signal proportional to the instantaneous current in the power line;
  b. voltage input means for producing an output voltage representative signal proportional to the instantaneous voltage in the power line;
  c. multiplier means for multiplying said voltage representative signal by said current representative signal to calculate the power in the power line, said mulitiplier means being connected to said output of said current input means and said output of said voltage input means, said multiplier means further comprising:
    (1) triangular wave generating means for generating a triangular wave output, said triangular wave generating means still further comprising:
      (a) squarewave generating means for producing a square waveform output and a first reference voltage and a second reference voltage, said squarewave generating means having a comparator means for driving an electronic switch means for switching said square waveform output of said squarewave generating means from the voltage level of one of said reference voltages to the voltage level of the other of said reference voltages, and having a resistive feedback means connecting said square waveform output of said squarewave generating means to an input of said comparator means;
      (b) integrator means for integrating said output of said squarewave generating means with respect to time to produce a triangular wave output, said integrator means having an input connected to said square waveform output of said squarewave generating means; and (c) amplifier means for amplifying said triangular wave output, said amplifier means having an input and a feedback means and producing said triangular waveform output, said input being connected to said triangular wave output of said integrator means, wherein the gain of said amplifier means is adjusted by connecting said triangular waveform output of said amplifier means to various points in a resistive means contained in said feedback means from said triangular waveform output to said input of said amplifier means;

(2) pulse width modulating means for modulating said triangular waveform output of said amplifier means of said triangular wave generating means by said voltage representative signal, said pulse width modulating means having two inputs and an output, said inputs being connected to said triangular waveform output of said amplifier means and to said output of said voltage input means;

(3) pulse height modulating means for modulating said current representative signal by said output of said pulse width modulating means, said pulse height modulating means having two inputs and an output, said inputs being connected to said output of said pulse width modulating means and to said output of said current input means; and, d. filter and amplifying means for filtering out alternating current components of said output of said pulse height modulating means and integrating and amplifying the remaining direct current component of said output of said pulse height modulating means to produce a highly stable direct current transducer output of improved accuracy which is directly proportional to the instantaneous power in the power line, said filter and amplifier means having an input connected to said output of said pulse height modulating means.

2. A transducer for monitoring power in a power line as recited in claim 1 wherein said input of said integrator means contains a resistive means of high resistance for minimizing any effect upon said triangular wave output caused by variation of said square waveform output of said squarewave generating means because of changes in resistance of said comparator means or said electronic switch means with variations in temperature and passages of time.

3. A transducer for monitoring power in a power line as recited in claim 1 wherein said pulse height modulating means is an electronic double-pole, double-throw switch, the position of which is determined by said output of said pulse height modulating means, which positioning determines the circuit path taken within said switch by said current representative signal whereby said output of said pulse height modulating means is said current representative signal modulated by said output of said pulse width modulating means, whereby portions of said output of said pulse height modulating means above zero value, as well as below zero value, are included in said output of said pulse height modulating means.

4. A transducer for monitoring power in a power line as recited in claim 1 wherein said square waveform output of said squarewave generating means is at such a high frequency relative to an alternating signal which may pass upon the power line that those portions of said alternating signal sampled by said multiplier means appear to be non-alternating signals, thereby rendering said multiplier means capable of multiplying alternating signals as well as non-alternating signals.

5. A system for monitoring power in a power line comprising:

a. watt transducer means for measuring active power in the power line further comprising:

(1) a first module containing means for producing a current representative output proportional to the instantaneous current in the power line and means for producing a voltage representative output proportional to the instantaneous voltage in the power line;

(2) a second module having at least two inputs and an output and containing multiplier means for multiplying said current representative output and said voltage representative output to produce a multiplier output, two of said second module inputs being connected to said current representative output and said voltage representative output, said second module also containing filter and amplifier means for filtering out alternating current components of said mulitplier output and integrating and amplifying a remaining direct current component of said multiplier output to produce as said output of said second module a direct current signal proportional to the instantaneous active power in the power line; and, b. var transducer means for measuring reactive power in the power line further comprising:

(1) a third module containing means for producing a current representative output proportional to the instantaneous current in the power line, means for producing a voltage representative output proportional to the instantaneous voltage in the power line, and phase shifting means for shifting the phase of said current representative output or said voltage representative output, or both of said representative outputs to produce a phase-conditioned current representative output and a phase-conditioned voltage representative output;

(2) a fourth module identical to said second module, two of said inputs of said fourth module being connected to said phase-conditioned current representative output and said phase-conditioned voltage representative output, and said output of said fourth module being a direct current signal proportional to the instantaneous reactive power in the power line.

6. A multiplier circuit comprising:

a. squarewave generating means for producing a square waveform output and a first reference voltage and a second reference voltage, said squarewave generating means having a comparator means for driving an electronic switch means to switch said square waveform output of said squarewave generating means from the voltage level of one of said reference voltages to the voltage level of the other of said reference voltages, and having a resistive feedback means connecting said square waveform output of said squarewave generating means to an input of said comparator means;

b. integrator means for integrating said output of said squarewave generating means with respect to time to produce a triangular wave output, said integrator means having an input connected to said output of said squarewave generating means;

c. amplifier means for amplifying said triangular wave output, said amplifier means having an input, a feedback means and a triangular waveform output, said input being connected to said triangular wave output of said integrator means, wherein the gain of said amplifier means is adjusted by connecting the triangular waveform output of said amplifying means to various points in a resistive means contained in said feedback means from said triangular waveform output to said input of said amplifier means;

d. pulse width modulating means for modulating said triangular waveform output of said amplifier means by a first electrical signal, said pulse width modulating means having two inputs and an output, said inputs being connected to said triangular waveform output of said amplifier means and to said first electrical signal; and, e. pulse height modulating means for modulating a second electrical signal by said output of said pulse width modulating means whereby said output of said pulse height modulating means is proportional to the instantaneous product of said first electrical signal and said second electrical signal, said pulse height modulating means having two inputs and an output, said inputs being connected to said output of said pulse width modulating means and to said second electrical signal.

7. A multiplier circuit as recited in claim 6 wherein said input of said integrator means contains resistive means of high resistance for minimizing any effect upon said triangular wave output caused by variations of said square waveform output of said squarewave generating means because of changes in resistance of said comparator means or said electronic switch means with variations in temperature and passages of time.

8. A multiplier circuit as recited in claim 6 wherein said pulse height modulating means is an electronic double-pole, double-throw switch, the position of which is determined by said output of said pulse width modulating means, which positioning determines the circuit path taken within said switch by said second electrical signal whereby said output of said pulse height modulating means is representative of said second electrical signal modulated by said first electrical signal.

9. A multiplier circuit as recited in claim 6 wherein said square waveform output of said squarewave generating means is of such high frequency relative to said first and second electrical signals that, when said first or second electrical signal is an alternating signal, those portions of said alternating signal sampled by said multiplier circuit appear to said multiplier circuit to be non-alternating signals, thereby rendering said multiplier circuit capable of multiplying alternating as well as non-alternating signals.

10. Circuitry for providing a stable triangular waveform comprising means providing a first reference voltage, an inverter circuit for tracking said first reference voltage and providing a second reference voltage equal to and opposite in polarity to said first reference voltage, a double throw electronic switch means connected to receive one of said reference voltages and being selectively actuable for switching from the level of one of said reference voltages to the level of the other said reference voltages to thereby provide a square waveform, an integrator means, means coupling said square waveform output from said switching means to said integrator means which generates a triangular waveform therefrom, summing means, first feedback means for coupling said triangular waveform from said integrator means to said summing means, second feedback means for coupling a square waveform from the output of said switch means to said summing means, said summing means summing said square waveform and said triangular waveform to provide a waveform having zero crossing characteristics, a comparator receiving said zero crossing waveform and providing an output to cyclically actuate said switch means to produce said square wave output waveform having peak values corresponding to the reference voltages, whereby the signal output from said integrator means comprises an extremely stable triangular waveform output relative to time and temperature.

11. A circuit as in claim 10 wherein the summing means comprises a thin film resistor network.

12. A circuit as in claim 10 further including a high resistance means connecting to the input of said electronic switch means to negate the effect of resistance change of said electronic switch due to temperature.

13. A transducer for monitoring power in an alternating current power system comprising means for providing signals representative of the current and voltage of said system, means for adjusting the sensitivity of said transducer to selectively accommodate the transducer to monitor a single phase and multiple phase power line, means for providing a triangular wave for modulating said signals, multiplier means connected to the means for providing a triangular wave, the multiplier means having a sensitivity which is inversely proportional to the amplitude of the triangular wave generated, means for adjusting the amplitude of the triangular wave including an amplifier having a feedback circuit, a plurality of resistor means in said feedback circuit, a defined terminal connection associated with each resistor means whereby the feedback circuit is selectively connected to vary the feedback resistance of said amplifiers to control the amplitude of the triangular wave output thereby adjusting the sensitivity of the transducer.

14. A transducer as in claim 13 further including multiplier means for multiplying the signal representative of voltage and current, said multiplier means comprising a distinct module, said module connected to receive direct current signals, and double throw electronic switch means for changing an operation of the multiplier module from an operation mode to a calibration mode, whereby direct current calibration of the multiplier module is effected.

* * * * *